(12) United States Patent
Nagulapalli et al.

(10) Patent No.: US 10,122,335 B2
(45) Date of Patent: Nov. 6, 2018

(54) LOW VOLTAGE HIGH SPEED CMOS LINE DRIVER WITHOUT TAIL CURRENT SOURCE

(71) Applicant: INPHI CORPORATION, Santa Clara, CA (US)

(72) Inventors: Rajasekhar Nagulapalli, Northampton (GB); Simon Forey, Northamptonshire (GB); Parmanand Mishra, Cupertino, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 15/811,036

(22) Filed: Nov. 13, 2017

(65) Prior Publication Data

US 2018/0069514 A1 Mar. 8, 2018

Related U.S. Application Data

(63) Continuation of application No. 15/201,287, filed on Jul. 1, 2016, now Pat. No. 9,847,762.

(51) Int. Cl.
*H03F 3/45* (2006.01)
*H03F 1/34* (2006.01)

(52) U.S. Cl.
CPC ....... *H03F 3/45183* (2013.01); *H03F 3/4565* (2013.01); *H03F 3/45188* (2013.01); *H03F 1/34* (2013.01); *H03F 3/45* (2013.01); *H03F 3/45479* (2013.01); *H03F 3/45659* (2013.01); *H03F 2203/45082* (2013.01); *H03F 2203/45418* (2013.01); *H03F 2203/45424* (2013.01); *H03F 2203/45481* (2013.01); *H03F 2203/45508* (2013.01); *H03F 2203/45652* (2013.01); *H03F 2203/45702* (2013.01)

(58) Field of Classification Search
CPC ............. H03F 3/45183; H03F 3/45717; H03F 3/45215; H03F 1/34; H03F 3/45; H03F 3/45479; H03F 3/4565; H03F 3/45659; H03F 3/45475
USPC .................................................. 330/259, 260
See application file for complete search history.

(56) References Cited

U.S. PATENT DOCUMENTS

| | | | | |
|---|---|---|---|---|
| 6,356,141 B1 * | 3/2002 | Yamauchi | ............... | G05F 3/262 323/312 |
| 6,661,288 B2 * | 12/2003 | Morgan | ............... | H03F 3/45659 330/258 |
| 6,731,135 B2 * | 5/2004 | Brunolli | ............... | H03F 3/45179 326/30 |
| 7,924,094 B2 * | 4/2011 | Sunairi | ............... | H03F 3/45183 330/257 |
| 9,209,789 B1 * | 12/2015 | Li | ............... | H03K 5/02 |

* cited by examiner

*Primary Examiner* — Khanh V Nguyen
(74) *Attorney, Agent, or Firm* — Richard T. Ogawa; Ogawa P.C.

(57) ABSTRACT

The present invention is directed to electrical circuits and techniques thereof. More specifically, an embodiment of the present invention provides a line driver with transistors directly coupled to the ground, and a bias voltage is coupled common mode resistors of the line driver. There are other embodiments as well.

20 Claims, 6 Drawing Sheets

LOW VOLTAGE HIGH SPEED CMOS LINE DRIVER WITHOUT TAIL CURRENT SOURCE

CROSS-REFERENCES TO RELATED APPLICATIONS

This application is a continuation of and claims priority to U.S. application Ser. No. 15/201,287, filed Jul. 1, 2016, and incorporated by reference herein for all purposes.

BACKGROUND OF THE INVENTION

The present invention is directed to electrical circuits and techniques thereof.

Differential amplifiers have a wide range of applications. In operation, a differential amplifier amplifies the difference between two input voltages (differential mode voltage) and suppresses voltage common (common mode voltage) to the two input voltages. For example, differential amplifiers are found in many circuits that utilize series negative feedback (op-amp follower, non-inverting amplifier, etc.), where one input is used for the input signal and the other for the feedback signal (usually implemented by operational amplifiers). For example, differential amplifiers have been used in volume control circuits and automatic gain control circuits. For data communication, differential amplifiers have also been used in amplitude modulation. For example, in communication system, a differential amplifier can be implemented as parts of a line driver.

Over the past, various types of differential amplifiers have been proposed and utilized. Unfortunately, in light of high-speed and low-power applications, conventional differential amplifiers have been inadequate. Therefore, improved systems and methods for differential amplifiers are desired.

BRIEF SUMMARY OF THE INVENTION

The present invention is directed to electrical circuits and techniques thereof. More specifically, an embodiment of the present invention provides a line driver with transistors directly coupled to the ground, and a bias voltage is coupled common mode resistors of the line driver. There are other embodiments as well.

According to an embodiment, the present invention provides a differential amplifier device that includes a voltage supply that is characterized by a first voltage level. The device further includes a common voltage source. The device additionally includes a first load resistor and a second load resistor. The first load resistor and the second load resistor are characterized by a first resistance value. The device further includes a first common resistor and a second common resistor. The common resistor being characterized by a second resistance value, which is higher than the first resistance value. The first common resistor is configured in series with the second common resistor. The common voltage source is coupled between the first common resistor. The device additionally includes a first voltage input and a second voltage input. The device also includes a first switch that has a first gate and a first drain and a first source. The first gate is coupled to the first voltage input. The first drain is coupled to the first load resistor and the first common resistor. The first source is coupled to a ground terminal. The device also includes a second switch that includes a second gate and a second drain and a second source. The second gate is coupled to the second voltage input. The second drain is coupled to the second load resistor and the first common resistor. The second source is coupled to the ground terminal. The differential amplifier is characterized by a swing voltage, the swing voltage being substantially equal to the first voltage level.

According to another embodiment, the present invention provides a line driver apparatus. The apparatus includes a bias resistor and a bias current source coupled to the bias resistor. The apparatus also includes an amplifier comprising a first input terminal and a second input terminal and output terminal. The first input terminal is coupled to the bias current source and the bias resistor. The apparatus also includes a pre driver module that is coupled to the output terminal. The pre driver module is configured to provide a first voltage input and a second voltage input. The apparatus further includes a voltage supply that is characterized by a first voltage level. The apparatus includes a common voltage source. The apparatus also includes a first load resistor and a second load resistor. The first load resistor and the second load resistor are characterized by a first resistance value. The apparatus also includes a first common resistor and a second common resistor. The first common resistor is characterized by a second resistance value. The second resistance value is higher than the first resistance value. The first common resistor is configured in series with the second common resistor. The common voltage source is coupled between the first common resistor and the second input terminal of the amplifier. The apparatus further includes a first switch comprising a first gate and a first drain and a first source. The first gate is coupled to the first voltage input. The first drain is coupled to the first load resistor and the first common resistor. The first source is coupled to a ground terminal. The apparatus also includes a second switch that has a second gate and a second drain and a second source. The second gate is coupled to the second voltage input. The second drain is coupled to the second load resistor and the first common resistor. The second source is coupled to the ground terminal. The differential amplifier is characterized by a swing voltage that is substantially equal to the first voltage level.

According to yet another embodiment, the present invention provides a line driver apparatus that includes a voltage supply that is characterized by a first voltage level. The apparatus also includes a common voltage source that has a first resistor and a second resistor configured in series. The first resistor and the second resistor are characterized by a predetermined resistance ratio. A common voltage terminal is coupled between the first resistor and the second resistor. The apparatus also includes a first load resistor and a second load resistor. The first load resistor and the second load resistor are characterized by a first resistance value. The apparatus further includes a first common resistor and a second common resistor. The first common resistor is characterized by a second resistance value that is higher than the first resistance value. The first common resistor is configured in series with the second common resistor. The common voltage terminal is coupled between the first common resistor. The apparatus also includes a first voltage input and a second voltage input. The apparatus further includes a first switch comprising a first gate and a first drain and a first source. The first gate is coupled to the first voltage input. The first drain is coupled to the first load resistor and the first common resistor. The first source is directly coupled to a ground terminal. The apparatus further includes a second switch comprising a second gate and a second drain and a second source. The second gate is coupled to the second voltage input. The second drain is coupled to the second load resistor and the first common resistor. The second source is directly coupled to the ground terminal.

It is to be appreciated that embodiments of the present invention provide many advantages over conventional techniques. Among other things, differential amplifiers according to embodiments of the present invention do not have tail current sources, which translates to a higher peak-to-peak swing voltage for the system compared to conventional implementations. Additionally, absence of tail current source also eliminates its undesirable capacitance, which causes tail current variation before and after input voltage transition. The decrease or elimination of tail capacitance improves switching speed. Additionally, when implemented with DFE, signal dependent glitches are reduced or eliminated. For DAC related systems and applications, system linear is also improved. Jitter and common mode output noise in high current driver implementations are reduced. There are other benefits as well.

Embodiments of the present invention can be implemented in conjunction with existing systems and processes. For example, the differential amplifiers and line driver devices according to embodiments of the present invention can be manufactured using existing equipment and processes, and they can be readily employed in existing systems.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention is directed to electrical circuits and techniques thereof. More specifically, an embodiment of the present invention provides a line driver with transistors directly coupled to the ground, and a bias voltage is coupled common mode resistors of the line driver. There are other embodiments as well.

Figure 1A:
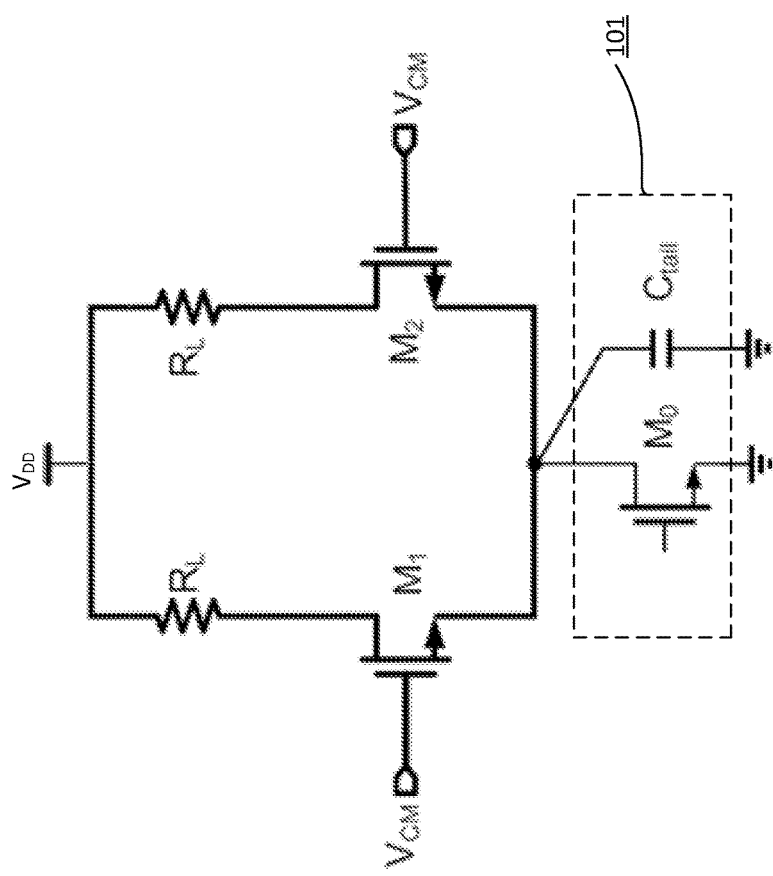
FIG. 1A is a simplified diagram illustrating a conventional differential amplifier circuit.

Differential amplifiers, as explained above, have a wide range of applications. In analog circuit design, a precision reference bias is required to get the operating current or voltage from a reference. More specifically, a reference bias controls the basic operations of the main circuit, which includes an amplifier and other circuit components. The precision bias governs the variability of the main circuit (i.e., over process, voltage, and temperature) to meet the specifications. Depending on the specification and implementation, differential amplifier performance can be characterized by linearity (as when used in DAC and related applications), voltage glitch on the tail current source, maximum output and swing voltage for a given supply voltage ($V_{DD}$), and minimum jitter and common mode output noise. FIG. 1A is a simplified diagram illustrating a conventional differential amplifier circuit. Switches M1 and M2 form a differential amplifier pair. For example, switches M1 and M2 are implemented using NMOS switches, and they are coupled to voltage supply $V_{DD}$ via their respective load resistors. Source terminals of the NMOS switches M1 and M2 are coupled to a "long tail", which can be a tail current source 101 as shown in FIG. 1A. The tail current source 101 comprises a transistor switch and a tail capacitor. A bias current source is typically coupled to the transistor switch ($M_0$) of the tail current source 101. For example, using a current source/sink in the "tail" is common configuration in amplifier circuits. Among other things, the long tail component is provided to improve the common mode capability of the circuit. Common mode signals are those that are applied to both inputs in the same polarity, and are generally required to be rejected. Using a simple resistive tail limits the common mode voltage that can be accommodated before severe distortion occurs.

Unfortunately, there are various drawbacks with long tail implementations. Among other things, the tail current source 101 as shown in FIG. 1A typically consumes about 100~200 mV drain to the source voltage, which reduces the swing voltage of the differential amplifier. Additionally, the tail current source 101 has a capacitance (e.g., capacitor $C_{tail}$), which often leads to a voltage glitch on the drain and causes tail current variation before and after the input voltage transition, as illustrated in FIG. 1B.

Figure 1B:
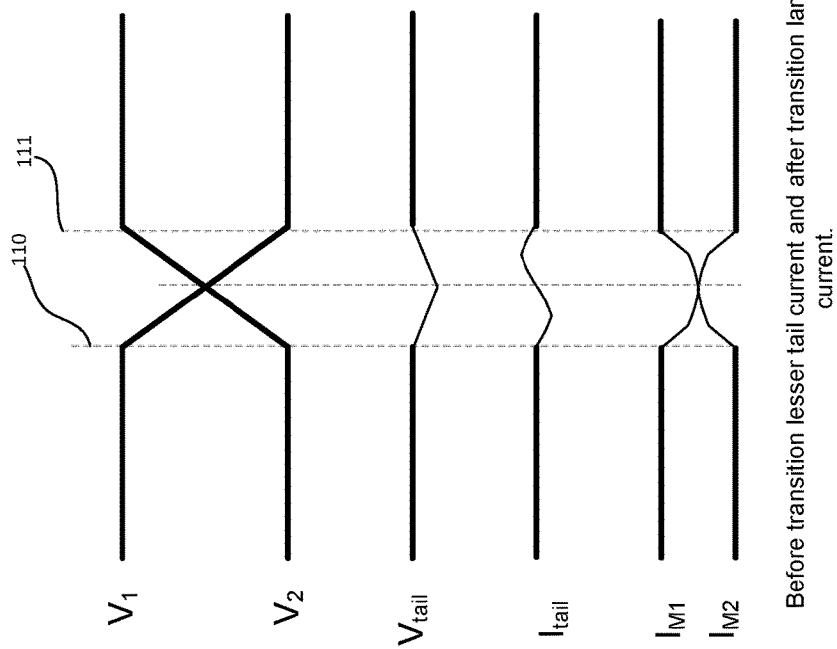
FIG. 1B is a simplified diagram illustrating electrical characteristics of a conventional differential amplifier circuit.

FIG. 1B is a simplified diagram illustrating electrical characteristics of a conventional differential amplifier circuit. As shown, during the time period between 110 and 111, input voltage $V_1$ transitions from high to low, and input voltage $V_2$ transitions from low to high. The tail voltage $V_{tail}$ and tail current $I_{tail}$ both show a "glitch" transition, which translates to current variation for $I_{M1}$ and $I_{M2}$ respectively at the switches M1 and M2.

In addition to undesirable tail current variation, the tail current source also contributes to a tail node capacitance that decreases the switching speed, which can be highly undesirable in high speed communication applications. When implemented with decision forward equalizer (DFE), the tail current source can also lead to signal-dependent glitches in DFE response. In DAC related implementations, tail current source may cause linearity problems as well. Furthermore, tail current source is often associated with jitter and common mode output noise in high current driver systems.

It is thus to be appreciated that embodiments of the present invention provide line driver systems implemented using differential amplifiers without the "long tail" configuration. As described in further details below, line driver systems according to the present invention are configured with defined bias current source through feedback mechanism, thus removing the need for the "long tail" configuration.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 2:
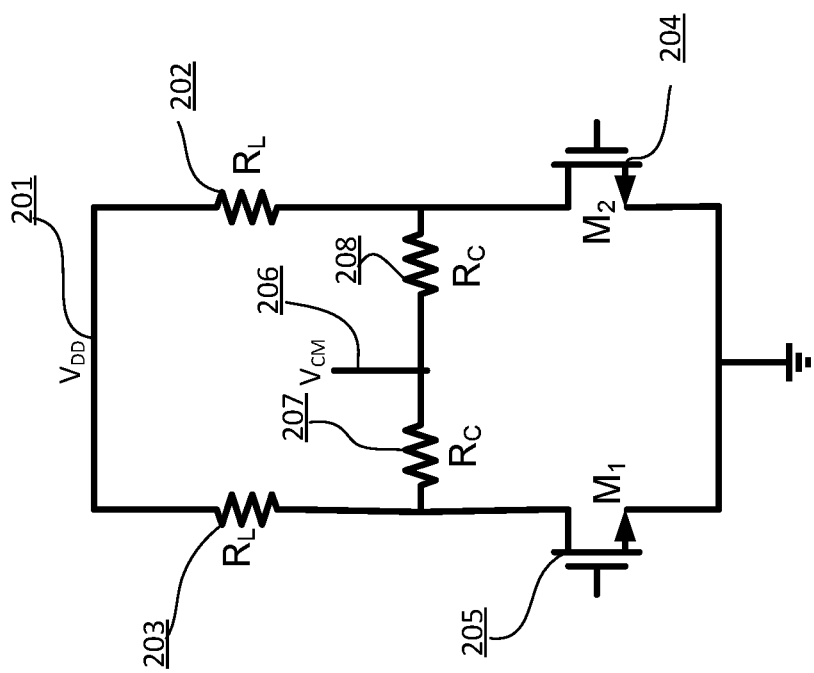
FIG. 2 is a simplified diagram illustrating a liner driver apparatus according to an embodiment of the present invention.

FIG. 2 is a simplified diagram illustrating a liner driver apparatus according to an embodiment of the present invention. This diagram is merely an example, which should not unduly limit the scope of the claims. One of ordinary skill in the art would recognize many variations, alternatives, and modifications. As explained above, embodiments of the present invention use a predefined bias current through a feedback system, which removes the need for tail current source. As shown in FIG. 2, a pair of NMOS switches provides a differential pair, which includes switch 205 and switch 206. Depending on the implementation, other types of switches may be used as well. For example, the differential pair can be implemented using a pair of PMOS transistors. It is to be appreciated that, instead of connecting to a tail current source, the source terminals of switches 205 and switch 206 directly couple to a ground terminal. The gate of switches 205 and switch 206 are coupled to differential input signals. The drain terminal of switch 205 is coupled to load resistor 203 and common resistor 207. The load resistor 203 is coupled to the voltage supply $V_{DD}$ 201. The drain terminal of switch 204 is coupled to load resistor 202 and common resistor 208. The load resistor 202 is coupled to the voltage supply $V_{DD}$ 202. It is to be appreciated that the range of voltage swing is defined by the voltage supply $V_{DD}$. In contrast, the swing voltage of a conventional differential amplifier (e.g., as illustrated in FIG. 1A) is reduced by the tail current source by an amount $V_{tail}$. Typically, the differential output (which is characterized by a gain value of the differential amplifier) is provided between a switch and its load resistor (e.g., between switch 205 and load resistor 203, or between switch 204 and load resistor 202). Common resistor 207 is coupled to load resistor 203 and switch 205. Common resistor 208 is coupled to load resistor 202 and switch 204. A common voltage terminal 206 is configured between common resistor 206 and common resistor 207. As explained above, the common voltage terminal provides a common voltage $V_{CM}$, which is used for a defined bias current through a feedback mechanism.

Figure 3:
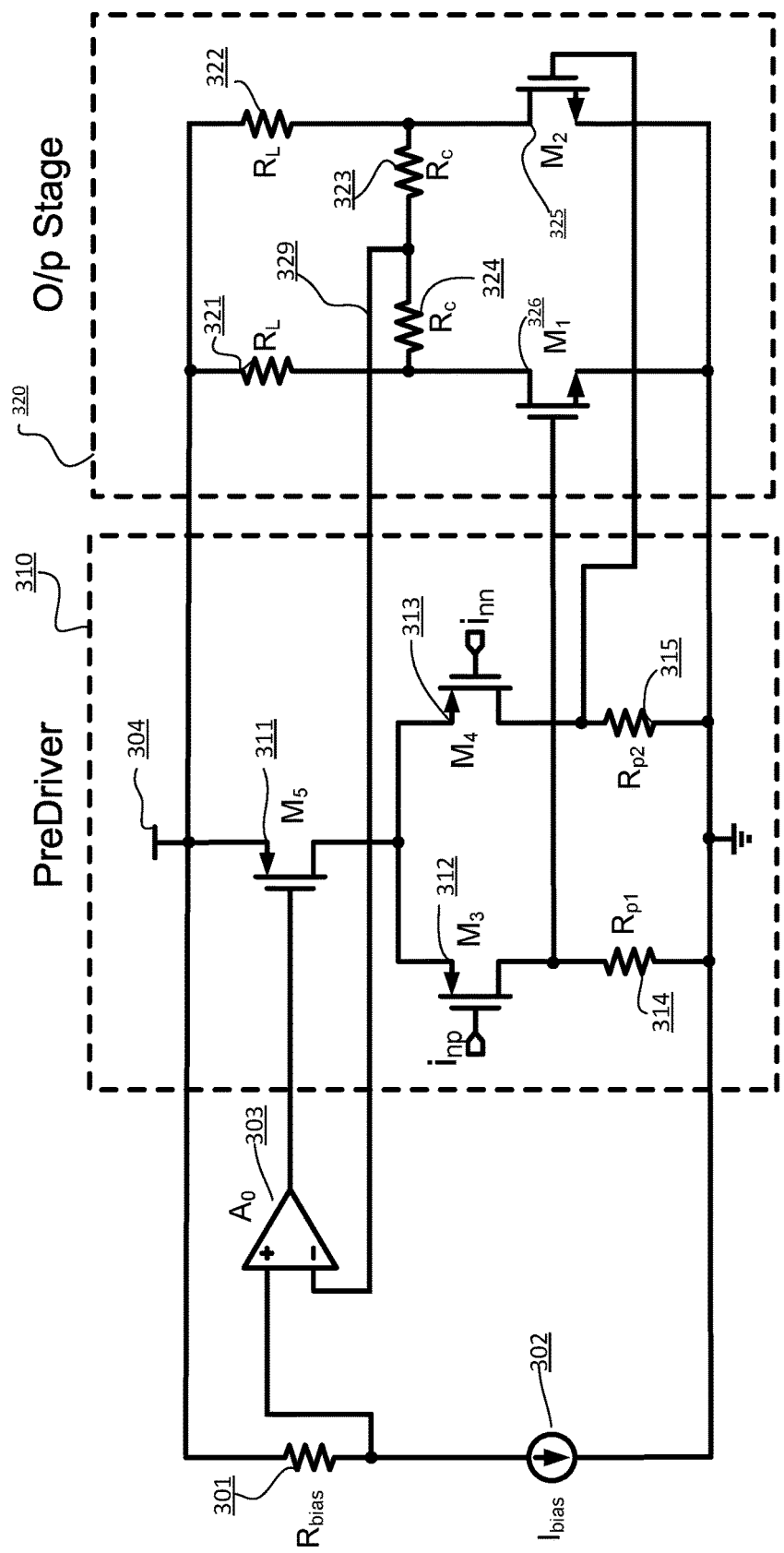
FIG. 3 is a simplified diagram illustrating a liner driver apparatus with a pre driver module according to an embodiment of the present invention.

FIG. 3 is a simplified diagram illustrating a liner driver apparatus with a pre driver module according to an embodiment of the present invention. This diagram is merely an example, which should not unduly limit the scope of the claims. One of ordinary skill in the art would recognize many variations, alternatives, and modifications. As shown in FIG. 3, a line driver apparatus includes, a pre-driver section 310, amplifier section 320, an operational amplifier 303, a bias resistor 301, and a bias current source 302. At the amplifier section 320, a differential amplifier configuration is provided by switches 325 and 326. For example, switches 325 and 326 are implemented using NMOS transistors as shown, but it is understood that other types of devices may be used as well. The source terminals of switches 325 and switch 326 are directly coupled to a ground terminal as shown. As explained above, by not having a tail current source coupled to the source terminals of switches 325 and switch 326, the swing voltage range of the amplifier section 320 is defined by the supply voltage $V_{DD}$ 304. Input signals switches 325 and switch 326 are received from the pre driver section 310. The drain terminal of switch 326 is coupled to load resistor 321 and common resistor 324. The load resistor 321 is coupled to the voltage supply $V_{DD}$ 304. The drain terminal of switch 325 is coupled to load resistor 322 and common resistor 323. The load resistor 322 is coupled to the voltage supply $V_{DD}$ 304. It is to be appreciated that the range of voltage swing is defined by the voltage supply $V_{DD}$. In contrast, the swing voltage of a conventional differential amplifier (e.g., as illustrated in FIG. 1A) is reduced by the tail current source by an amount $V_{tail}$. Typically, the differential output (which is characterized by a gain value of the differential amplifier) is provided between a switch and its load resistor (e.g., between switch 326 and load resistor 321, or between switch 325 and load resistor 322).

Common resistor 324 is coupled to load resistor 321 and switch 326. Common resistor 323 is coupled to load resistor 322 and switch 325. A common voltage terminal 329 is configured between common resistor 324 and common resistor 323. For example, the resistances of resistor 321 and resistor 322 are matched to be close to each other (e.g., less than 1% difference in resistance value); resistances of resistor 324 and resistor 323 are similarly matched. The resistance value of the load resistors are much less than resistance value of the common resistors. For example, the common resistors 323 and 324 may have a resistance value of about 10K ohms, while the load resistors 321 and 322 have a resistance value of about 50 ohms. The resistance value ratio between load resistors and common resistors helps reduce amount of common mode signal at terminal 329. The common voltage terminal 329 is provided as an input to the amplifier 303 as shown.

The pre driver section 310 includes switch 311 (switch M5) that is coupled to voltage supply and the output of amplifier 303. For example, amplifier 303 comprises an operation amplifier device. For example, amplifier 303 is configured as part of a feedback mechanism, who inputs include common voltage terminal 329 and a reference bias voltage defined by the bias resistor 301 ($R_{bias}$) and the bias current source 302 ($I_{bias}$). The common voltage terminal 329, coming from the amplifier section 320, provides a feedback for the line driver system. By comparing inputs from common voltage terminal 329 and the reference bias voltage, the amplifier 303 provides an output that adjusts the gate voltage of switch 311. For example, switch 311 comprises a PMOS transistor. The common mode voltage between switch 312 and switch 313 is in turn controlled by the output of switch 311. Switch 312 and switch 313, according to various embodiments, are implemented using PMOS transistors. The gate of switch 312 is coupled to input $I_{np}$. The gate of switch 313 is coupled to input $I_{nn}$. Switch 312 and switch 313 are respectively coupled to resistor 314 and resistor 315. For example, resistor 314 and resistor 315 function as load resistors respectively for switch 312 and switch 315. The output of switch 312 is coupled to the gate of switch 326. The output of switch 313 is coupled to the gate of switch 325. By adjusting gate 311 via the feedback mechanism, the outputs of switch 312 and switch 313 can be adjusted, which in turn adjust the inputs for switch 325 and switch 326.

As shown in FIG. 3, the amplifier section 320 are implemented with two NMOS transistors for switch 325 and switch 326. The pre-driver section 310 include two PMOS transistors for switch 312 and switch 313. In certain embodiments, the amplifier section 320 is implemented with two PMOS transistors, and the pre-driver section 310 is implemented using NMOS transistors.

The output of the switches are coupled to load resistors. For example, the output of switch 312 is coupled to resistor 314. Output of switch 313 is coupled to resistor 315. For example, resistor 314 and resistor 315 function as output devices for the pre driver section 310. In various implementations, other types of output devices may be used. For example, NMOS transistors can be used as output devices for pre driver section 310. Depending on the implementation, the output devices for pre driver section 310 may be based on the speed requirement of communication systems.

It is to be appreciated that in certain operations, high frequency $V_{DD}$ and $V_{SS}$ noises sometimes appear as common mode noises, which is similar to the noise profiles of conventional differential amplifier implementations. As with other types of integrated circuit devices, actual device performance is affected by pressure, voltage, and temperature (PVT). More specifically, swing voltage of the driver system can be affected by the PVT system. In various implementations, the configuration of the line driver system illustrated in FIG. 3 is specifically implemented to match the system load and output devices.

Figure 4:
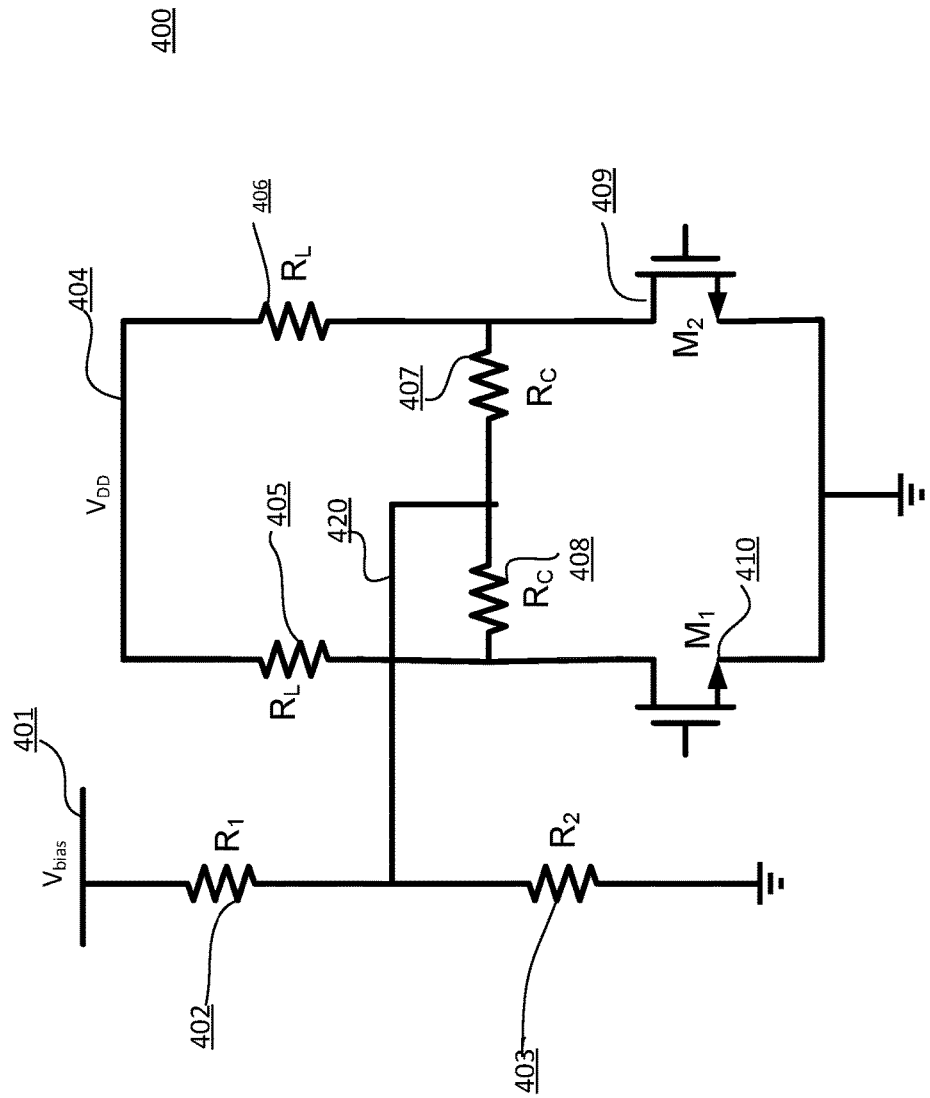
FIG. 4 is a simplified diagram illustrating a liner driver apparatus with a voltage divider module according to an embodiment of the present invention.

FIG. 4 is a simplified diagram illustrating a liner driver apparatus with a voltage divider module according to an embodiment of the present invention. This diagram is merely an example, which should not unduly limit the scope of the claims. One of ordinary skill in the art would recognize many variations, alternatives, and modifications. As shown in FIG. 2, a pair of NMOS switches provides a differential pair, which includes switch 410 and switch 409. Depending on the implementation, other types of switches (e.g., PMOS transistors) may be used as well. It is to be appreciated that, instead of connecting to a tail current source, the source terminals of switches 410 and switch 409 directly couple to a ground terminal. The gate of switches 410 and switch 409 are coupled to differential input signals. The drain terminal of switch 410 is coupled to load resistor 405 and common resistor 408. The load resistor 405 is coupled to the voltage supply $V_{DD}$ 404. The drain terminal of switch 409 is coupled to load resistor 406 and common resistor 407. The load resistor 406 is coupled to the voltage supply $V_{DD}$ 404. It is to be appreciated that the range of voltage swing is defined by the voltage supply $V_{DD}$. In contrast, the swing voltage of a conventional differential amplifier (e.g., as illustrated in FIG. 1A) is reduced by the tail current source by an amount $V_{tail}$. Typically, the differential output (which is characterized by a gain value of the differential amplifier) is provided between a switch and its load resistor (e.g., between switch 410 and load resistor 405, or between switch 409 and load resistor 406). Common resistor 408 is coupled to load resistor 405 and switch 410. Common resistor 407 is coupled to load resistor 406 and switch 409. A common voltage terminal 420 is configured between common resistor 408 and common resistor 407. For example, the common voltage terminal provides a common voltage $V_{CM}$, which is used for a defined bias current through a feedback mechanism. The common voltage terminal 420 is provided between resistor 402 and resistor 403. For example, resistor 402 and resistor 403 are configured in series and form a voltage divider between bias voltage 401 and the ground terminal. For example, the ratio of resistance values between resistor 402 and resistor 403 is predefined based on the actual implementations.

Figure 5B:
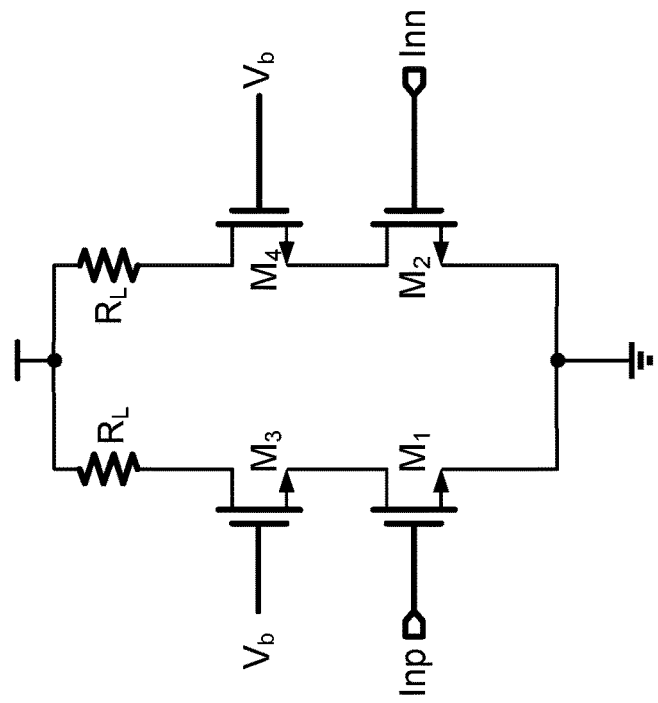
FIGS. 5A and 5B are simplified diagrams illustrating swing voltages of line driver devices according to embodiments of the present invention.
Figure 5A:
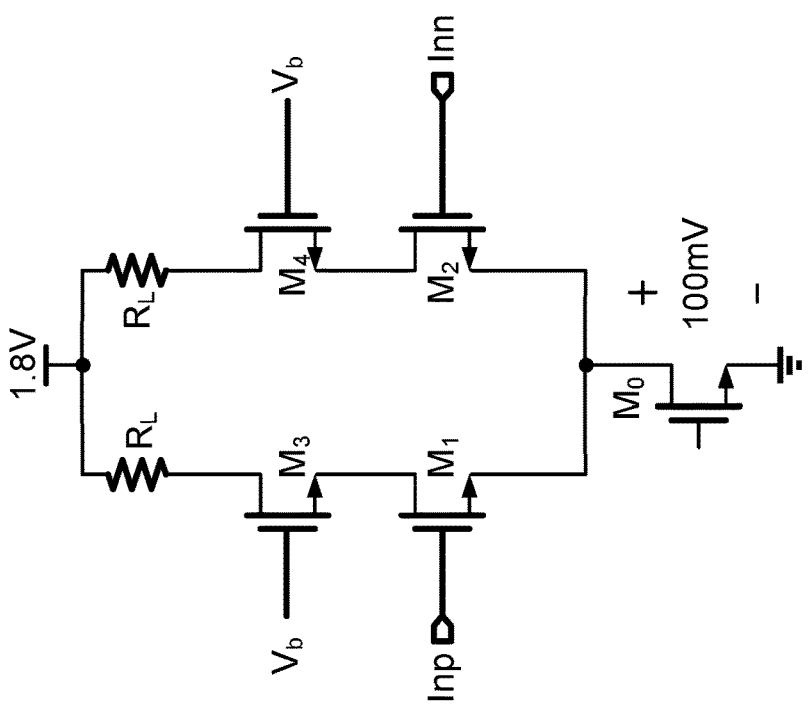

FIGS. 5A and 5B are simplified diagrams illustrating swing voltage of line driver devices according to embodiments of the present invention. This diagram is merely an example, which should not unduly limit the scope of the claims. One of ordinary skill in the art would recognize many variations, alternatives, and modifications. As shown in FIG. 5A, a conventional different amplifier device includes a tail current source ($M_0$) that is characterized by a voltage of 100 mV, which effectively reduces the peak-to-peak (P2P) swing voltage of the different amplifier by a 100 mV. For example, the swing voltage of the differential amplifier in FIG. 5A can be calculated using the equations below:

$$\text{Assume } Vth = 500 \text{ mV}$$

$$\begin{aligned}\text{Minimum bias voltage } V_b \text{ required for cascade} &= V_{th3} + Vds_1 + Vds_3 + vds_0 \\ &= 500 \text{ m} + 100 \text{ m} + \\ &\quad 100 \text{ m} + 100 \text{ m} \\ &= 800 \text{ m}\end{aligned}$$

$$\begin{aligned}\text{Min voltage of } M3 \text{ drain} &= Vb - Vth3 \\ &= 300 \text{ mV}\end{aligned}$$

$$\begin{aligned}P2P \text{ differential swing} &= 2*(Vdd - Vb + Vth3) \\ &= 3 \text{ v}\end{aligned}$$

As shown in FIG. 5B, a differential amplifier device according to embodiments of the present invention eliminates the need for a tail current source. As explained above, by eliminating the need of a tail current source, the P2P differential swing voltage of a differential amplifier according to embodiments of the present invention is increased. For example, the P2P differential swing voltage for the differential amplifier device in FIG. 5B can be calculated using the equations below:

$$\text{Assume threshold voltage } V_{th} = 400 \text{ mV}$$

$$\begin{aligned}\text{Minimum bias voltage } V_b \text{ required for cascode} &= V_{th3} + Vds_1 + Vds_3 \\ &= 500\text{ m} + 100\text{ m} + 100\text{ m} \\ &= 700\text{ m}\end{aligned}$$

$$\begin{aligned}\text{Min voltage of } M3 \text{ drain} &= Vb - Vth3 \\ &= 200 \text{ mV}\end{aligned}$$

$$\begin{aligned}\text{P2P differential swing} &= 2*(Vdd - Vb + Vth3) \\ &= 3.2 \text{ v}\end{aligned}$$

By comparing differential amplifiers illustrated in FIGS. 5A and 5B, it is to be appreciated that differential amplifiers according to embodiments of the present invention afford a bigger P2P swing voltage when compared to conventional devices. In addition, line driver devices and differential amplifier devices according to embodiments of the present invention provide many other advantages over conventional devices.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A data communication system comprising:
a voltage supply, the voltage supply being characterized by a first voltage level;
a common voltage source comprising a voltage divider, the voltage divider comprises a pair of resistors characterized by predetermined resistance values, the common voltage source being coupled to a bias voltage;
a first load resistor and a second load resistor, the first load resistor and the second load resistor being characterized by a first resistance value;
a first common resistor and a second common resistor, the first common resistor being characterized by a second resistance value, the second resistance value being higher than the first resistance value, the first common resistor being configured in series with the second common resistor, the common voltage source being coupled between the first common resistor and the second common resistor;
a first voltage input and a second voltage input;
a first switch comprising a first gate and a first drain and a first source, the first gate being coupled to the first voltage input, the first drain being coupled to the first load resistor and the first common resistor, the first source being coupled to a ground terminal; and
a second switch comprising a second gate and a second drain and a second source, the second gate being coupled to the second voltage input, the second drain being coupled to the second load resistor and the second common resistor, the second source being coupled to the ground terminal.

2. The system of claim 1 further comprising a first load resistor and a second load resistor, the first load resistor and the second load resistor being characterized by a first resistance value.

3. The system of claim 2 wherein the operational amplifier is coupled to a bias voltage.

4. The system of claim 3 wherein the bias voltage comprises a bias resistor and a bias current source.

5. The system of claim 1 wherein the first switch comprises an NMOS transistor.

6. The system of claim 1 wherein the first voltage input is coupled to a pre-driver module.

7. The system of claim 6 wherein the pre-deriver module is coupled to the operational amplifier.

8. The system of claim 6 wherein the pre-deriver module comprises PMOS transistors.

9. The system of claim 1 wherein the second resistor value is at least 100 times greater than the first resistor value.

10. A line driver apparatus comprising:
a bias voltage;
an amplifier comprising a first input terminal and a second input terminal and an output terminal, the first input terminal being coupled to the bias voltage;
a pre-driver module, the pre-driver module being coupled to the output terminal, the pre-driver module being configured to provide a first voltage input and a second voltage input, the pre-driver comprises a pair of PMOS transistors coupled to a pair of input signals;
a common voltage source;
a first load resistor and a second load resistor, the first load resistor and the second load resistor being characterized by a first resistance value;
a first common resistor and a second common resistor, the first common resistor and the second common resistor being characterized by a second resistance value, the second resistance value being higher than the first resistance value, the first common resistor being configured in series with the second common resistor, the common voltage source being coupled between the first common resistor and common resistor the second input terminal of the amplifier;
a first switch comprising a first gate and a first drain and a first source, the first gate being coupled to the first voltage input, the first drain being coupled to the first load resistor and the first common resistor, the first source being coupled to a ground terminal; and
a second switch comprising a second gate and a second drain and a second source, the second gate being coupled to the second voltage input, the second drain being coupled to the second load resistor and the second common resistor, the second source being coupled to the ground terminal.

11. The apparatus of claim 10 wherein the pre-driver module comprises a third switch coupled to the output terminal of the amplifier.

12. The apparatus of claim 11 wherein the third switch is coupled to the voltage supply.

13. The apparatus of claim 10 further comprising a voltage supply, the voltage supply being characterized by a first voltage level, the line driver being characterized by a swing voltage, the swing voltage being substantially equal to the first voltage level.

14. The apparatus of claim 10 wherein the pair of PMOS transistors are respectively coupled to a pair of pre-driver resistors.

15. The apparatus of claim 10 wherein the bias voltage comprises a bias resistor and a bias current source configured in series.

16. The apparatus of claim 15 wherein the bias resistor is configured between the voltage supply and the bias current source.

17. A line driver apparatus, comprising:
a common voltage source comprising a first resistor and a second resistor configured in series, the first resistor and the second resistor being characterized by a predetermined resistance ratio, a common voltage terminal being coupled between the first resistor and the second resistor;
a first load resistor and a second load resistor, the first load resistor and the second load resistor being characterized by a first resistance value;
a first common resistor and a second common resistor, the first common resistor being characterized by a second resistance value, the second resistance value being higher than the first resistance value, the first common resistor being configured in series with the second common resistor, the common voltage terminal being coupled between the first common resistor and the second common resistor;
a first switch comprising a first gate and a first drain and a first source, the first gate being coupled to a first voltage input, the first voltage input being associated with the common voltage, the first drain being coupled to the first load resistor and the first common resistor, the first source being directly coupled to a ground terminal; and
a second switch comprising a second gate and a second drain and a second source, the second gate being coupled to a second voltage input, the second voltage input being associated with the common voltage, the second drain being coupled to the second load resistor and the second common resistor, the second source being directly coupled to the ground terminal.

18. The apparatus of claim 17 wherein the first resistor is coupled to the voltage supply and the second resistor is coupled to the ground terminal.

19. The apparatus of claim 17 the common voltage terminal is coupled to an operational amplifier.

20. The apparatus of claim 17 further comprising a voltage supply, the voltage supply being characterized by a first voltage level, wherein the differential amplifier is characterized by a swing voltage, the swing voltage being substantially equal to the first voltage level.

* * * * *